(12) United States Patent
Park et al.

(10) Patent No.: US 12,402,424 B2
(45) Date of Patent: Aug. 26, 2025

(54) IMAGE SENSING DEVICE

(71) Applicant: SK hynix Inc., Icheon-si (KR)

(72) Inventors: Soon Yeol Park, Icheon-si (KR); Hye Won Mun, Icheon-si (KR); Kyung Do Kim, Icheon-si (KR); Young Hwan Park, Icheon-si (KR); Hyuk An, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 349 days.

(21) Appl. No.: 17/870,117

(22) Filed: Jul. 21, 2022

(65) Prior Publication Data

US 2023/0094071 A1 Mar. 30, 2023

(30) Foreign Application Priority Data

Sep. 27, 2021 (KR) ................... 10-2021-0127013

(51) Int. Cl.
*H10F 39/00* (2025.01)
*H10F 39/18* (2025.01)

(52) U.S. Cl.
CPC .......... *H10F 39/802* (2025.01); *H10F 39/18* (2025.01); *H10F 39/8037* (2025.01); *H10F 39/807* (2025.01)

(58) Field of Classification Search
CPC ......... H01L 27/14603; H01L 27/14612; H01L 27/14643; H10F 39/802; H10F 39/8037; H10F 39/803
See application file for complete search history.

(56) References Cited

U.S. PATENT DOCUMENTS

| | | |
|---|---|---|
| 2013/0320407 A1 | 12/2013 | Ahn |
| 2019/0020835 A1 | 1/2019 | Takahashi et al. |
| 2020/0119082 A1* | 4/2020 | Lee ................. H01L 27/14831 |
| 2020/0251512 A1 | 8/2020 | Im et al. |

FOREIGN PATENT DOCUMENTS

| | | |
|---|---|---|
| CN | 109218635 A | 1/2019 |
| CN | 111048537 A | 4/2020 |
| CN | 112185986 A | 1/2021 |
| CN | 113224087 A | 8/2021 |
| JP | 2008283615 A | 11/2008 |
| JP | 2012124339 A | 6/2012 |
| KR | 20170131928 A | 12/2017 |
| KR | 20200041144 A | 4/2020 |
| KR | 20200118723 A | 10/2020 |

OTHER PUBLICATIONS

CN Office Action for CN Appl. No. 202210841028.2, mailed on Oct. 29, 2024, 11 pages.
Notice of Allowance for CN Appl. No. 202210841028.2, mailed Mar. 17, 2025, 4 pages.

* cited by examiner

*Primary Examiner* — Thanh Luu
(74) *Attorney, Agent, or Firm* — Perkins Coie LLP

(57) ABSTRACT

An image sensing device includes a unit pixel configured to have a shape with first, second, third and fourth vertices where the second vertex and the third vertex are positioned in a diagonal direction of the unit pixel, a floating diffusion region disposed adjacent to the first vertex of the unit pixel, a transfer gate abutting on the floating diffusion region, a source region disposed adjacent to the second vertex of the unit pixel, a drain region disposed adjacent to the third vertex of the unit pixel, and a pixel transistor gate positioned between the source region and the drain region.

15 Claims, 11 Drawing Sheets

IMAGE SENSING DEVICE

CROSS-REFERENCES TO RELATED APPLICATION

This patent document claims the priority and benefits of Korean Patent Application No. 10-2021-0127013 filed on Sep. 27, 2021, which is incorporated herein by reference in its entirety as part of the disclosure of this patent document.

TECHNICAL FIELD

Various embodiments generally relate to an image sensing device.

BACKGROUND

Image sensing device capture optical images by converting light into electrical signals using a photosensitive semiconductor material which reacts to light. With the development of automobile, medical, computer and communication industries, the demand for high-performance image sensing devices is increasing in various devices such as a smartphone, a digital camera, a game machine, the Internet of Things, a robot, a security camera and a medical micro camera.

The image sensing devices may be generally divided into CCD (charge coupled device) image sensing devices and CMOS (complementary metal oxide semiconductor) image sensing devices. CCD image sensing devices provide better image quality than CMOS image sensing devices, but have larger sizes and consume more power than CMOS image sensing devices. On the other hand, CMOS image sensing devices have smaller sizes and consume less power than CCD image sensing devices. Also, since CMOS image sensing device can be manufactured using the CMOS manufacturing technology, a photosensitive element and a signal processing circuit may be integrated into a single chip, making it possible miniaturize image sensing devices at a low cost. For these reasons, CMOS image sensing devices are being developed for many applications including mobile devices.

SUMMARY

Various embodiments relate to an image sensing device that can secure a channel length of a pixel transistor while maintaining or reducing its size.

The disclosed technology can be implemented in some embodiments to provide an image sensing device that can secure its pixel transistor region while reducing its pixel size.

In accordance with an embodiment of the disclosed technology, an image sensing device may include: a unit pixel configured to have a shape with first, second, third and fourth vertices where the second vertex and the third vertex are positioned in a diagonal direction of the unit pixel, a floating diffusion region disposed adjacent to the first vertex of the unit pixel, a transfer gate abutting on the floating diffusion region, a source region disposed adjacent to the second vertex of the unit pixel, a drain region disposed adjacent to the third vertex of the unit pixel, and a pixel transistor gate positioned between the source region and the drain region.

In some implementations, the pixel transistor gate is any one of a driving transistor gate, a selection transistor gate and a reset transistor gate.

In some implementations, the unit pixel includes a photoelectric conversion region formed in a substrate and generates photocharges corresponding to an incident light, and the transfer gate includes a recess gate extending from one surface of the substrate toward the photoelectric conversion region.

In some implementations, the unit pixel includes a contact region disposed adjacent to the fourth vertex of the unit pixel, and a substrate voltage is applied to the contact region.

In some implementations, the unit pixel may include a photoelectric conversion region formed in a substrate and configured to generate photocharges corresponding to an incident light and an isolation region isolating the photoelectric conversion region from another adjacent unit pixel.

In accordance with an embodiment of the disclosed technology, an image sensing device may include: a pixel group including four unit pixels adjacent to one another, each unit pixel configured to have a shape with first, second, third and fourth vertices and configured to detect incident light and generate photocharge corresponding to an intensity of the incident light, each unit pixel comprising a floating diffusion region disposed adjacent to the first vertex of the unit pixel and configured to accumulate the photocharge generated by the unit pixel, a transfer gate abutting on the floating diffusion region and configured to transfer the photocharge accumulated in the floating diffusion region, a source region disposed adjacent to the second vertex of the unit pixel, a drain region disposed adjacent to the third vertex of the unit pixel and a pixel transistor gate positioned between the source region and the drain region, wherein the second vertex and the third vertex are positioned in a diagonal direction of the unit pixel.

In some implementations, two of the pixel transistor gates included in the pixel group are driving transistor gates, and the driving transistor gates are coupled to each other In some implementations, at least one of the pixel transistor gates included in the pixel group is a double conversion gain transistor gate.

In some implementations, the first vertices of the unit pixels included in the pixel group are positioned adjacent to a center of the pixel group.

In some implementations, the floating diffusion regions included in the pixel group are positioned adjacent to the center of the pixel group.

In some implementations, the floating diffusion regions included in the pixel group are electrically coupled to one another.

In some implementations, the first vertices of the unit pixels included in the pixel group are positioned in the same direction from centers of the respective unit pixels.

In accordance with an embodiment of the disclosed technology, an image sensing device may include: a pixel group including eight unit pixels adjacent to one another in a 2×4 matrix configuration, each unit pixel configured to have first, second, third and fourth vertices and configured to detect incident light and generate photocharge corresponding to an intensity of the incident light, each unit pixel comprising a floating diffusion region disposed adjacent to the first vertex of the unit pixel and configured to accumulate the photocharges generated by the unit pixel, a transfer gate abutting on the floating diffusion region and configured to transfer the photocharge accumulated in the floating diffusion region, a source region disposed adjacent to the second vertex of the unit pixel, a drain region disposed adjacent to the third vertex of the unit pixel and a pixel transistor gate positioned between the source region and the drain region, wherein the second vertex and the third vertex are positioned in a diagonal direction of the unit pixel.

In some implementations, four of the pixel transistor gates included in the pixel group are driving transistor gates, and the driving transistor gates are coupled to one another.

In some implementations, at least one of the pixel transistor gates included in the pixel group is a double conversion gain transistor gate.

In some implementations, the floating diffusion regions included in the pixel group are electrically coupled to one another.

In an embodiment, an image sensing device may include: a floating diffusion region disposed adjacent to a first vertex of a unit pixel; a transfer gate abutting with the floating diffusion region; a source region disposed adjacent to a second vertex of the unit pixel; a drain region disposed adjacent to a third vertex of the unit pixel; and a pixel transistor gate positioned between the source region and the drain region, wherein the second vertex and the third vertex are positioned in a diagonal direction of the unit pixel.

In an embodiment, an image sensing device may include: a pixel group configured by four unit pixels which are adjacent to one another, each unit pixel including: a floating diffusion region disposed adjacent to a first vertex of the unit pixel; a transfer gate abutting with the floating diffusion region; a source region disposed adjacent to a second vertex of the unit pixel; a drain region disposed adjacent to a third vertex of the unit pixel; and a pixel transistor gate positioned between the source region and the drain region, wherein the second vertex and the third vertex are positioned in a diagonal direction of the unit pixel.

In an embodiment, an image sensing device may include: a pixel group configured by eight unit pixels which are adjacent to one another and form a 2×4 matrix, each unit pixel including: a floating diffusion region disposed adjacent to a first vertex of the unit pixel; a transfer gate abutting with the floating diffusion region; a source region disposed adjacent to a second vertex of the unit pixel; a drain region disposed adjacent to a third vertex of the unit pixel; and a pixel transistor gate positioned between the source region and the drain region, wherein the second vertex and the third vertex are positioned in a diagonal direction of the unit pixel.

The image sensing device according to the embodiments of the present disclosure may sufficiently secure a region for forming a pixel transistor gate in a miniaturized unit pixel.

In addition, according to the various embodiments of the present disclosure, as the distance between a source region and a drain region of a pixel transistor is sufficiently secured, a short channel effect that may occur in the pixel transistor may be prevented.

Besides, a variety of effects directly or indirectly understood through the present document may be provided.

DETAILED DESCRIPTION

Hereafter, various embodiments will be described with reference to the accompanying drawings. However, it should be understood that the present disclosure is not limited to specific embodiments, but includes various modifications, equivalents and/or alternatives. The embodiments of the present disclosure may provide various effects that can be directly/indirectly recognized through the present disclosure.

Figure 1:
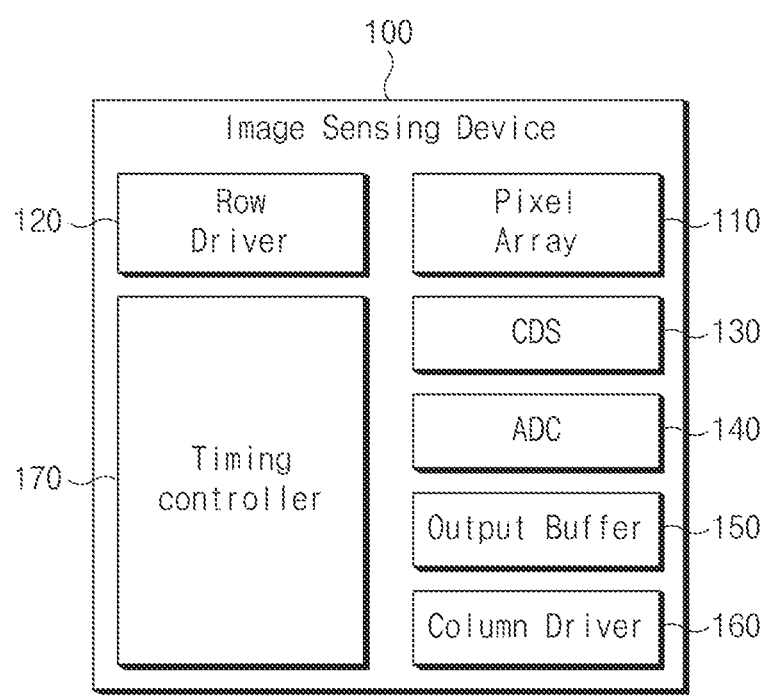
FIG. 1 is a block diagram illustrating an example of an image sensing device based on some embodiments of the disclosed technology.

FIG. 1 is a block diagram illustrating an example of an image sensing device based on some embodiments of the disclosed technology.

In some example implementations, an image sensing device 100 may include a pixel array 110, a row driver 120, a correlated double sampler (CDS) 130, an analog-to-digital converter (ADC) 140, an output buffer 150, a column driver 160 and a timing controller 170.

The pixel array 110 may include a plurality of unit pixels arranged in rows and columns. In an embodiment, the plurality of unit pixels may be arranged in a two-dimensional pixel array including rows and columns. In another embodiment, the plurality of unit pixels may be arranged in a three-dimensional pixel array. The plurality of unit pixels may convert optical signals into electrical signals on a unit pixel basis or on a pixel group basis, and unit pixels within each pixel group may share one or more internal circuits.

The pixel group may include a plurality of unit pixels. For ex ample, the unit pixels included in the pixel group may be arranged in a matrix configuration. The pixel array 110 may receive, from the row driver 120, a driving signal, including a row select signal, a pixel res et signal and a transfer signal. In response to the driving signal, a corresponding unit pixel of the pixel array 110 may be activated to perform an operation corresponding to the row select signal, the pixel reset signal and the transfer signal.

The row driver 120 may activate the pixel array 110 to perform specific operations on unit pixels included in a corresponding row, on the basis of commands and control signals which are applied by the timing controller 170. In an embodiment, the row driver 120 may select at least one unit pixel arranged in at least one row of the pixel array 110. The row driver 120 may generate a row select signal to select at least one of the plurality of rows. The row driver 120 may sequentially enable the pixel reset signal and the transfer signal for pixels corresponding to a selected row. In this way, an analog type reference signal and an analog type image signal which are generated by each of the pixels of the selected row may be sequentially transferred to the correlated double sampler 130. The reference signal may be an electrical signal that is provided to the correlated double sampler 130 when a sensing node (e.g., a floating diffusion region node) of a unit pixel is reset, and the image signal may be an electrical signal that is provided to the correlated double sampler 130 when photocharges generated by the unit pixel are accumulated in the sensing node. The reference signal can indicate reset noise inherent to the pixel and the image signal can indicate the intensity of incident light. The reference signal and the image signal may be collectively referred to as a pixel signal.

A CMOS image sensor may use correlated double sampling by sampling a pixel signal twice in order to remove the difference between two samples, removing an undesired offset value (e.g., fixed pattern noise) of a pixel. For example, in the correlated double sampling, by comparing pixel output voltages acquired before and after photocharges generated by incident light are accumulated in a sensing node, an undesired offset value may be removed to generate a pixel output voltage that represents only incident light intensity. In an embodiment, the correlated double sampler 130 may sequentially sample and hold reference signals and image signals provided to a plurality of respective column lines from the pixel array 110. In other words, the correlated double sampler 130 may sample and hold the levels of a reference signal and an image signal corresponding to each of the columns of the pixel array 110.

The correlated double sampler 130 may transfer the reference signal and the image signal of each of the columns to the ADC 140 as a correlated double sampling signal, on the basis of a control signal from the timing controller 170.

The ADC 140 may convert the correlated double sampling signal received from the correlated double sampler 130 for each column, into a digital signal. In an embodiment, the ADC 140 may be implemented as a ramp comparison type ADC. The ramp comparison type ADC may include a comparison circuit to compare a ramp signal, which ramps up and down, with an analog pixel signal, and may include a counter to perform a counting operation until the ramp signal matches the analog pixel signal. In an embodiment, the ADC 140 may convert the correlated double sampling signal for each of the columns, genera ted by the correlated double sampler 130, into a digital signal.

The ADC 140 may include a plurality of column counters corresponding to the columns of the pixel array 110, respectively. The columns of the pixel array 110 may be coupled to the column counters, respectively, and image data may be generated by converting the correlated double sampling signals, corresponding to the respective columns, into digital signals by using the column counters. In another embodiment, the ADC 140 may include one global counter, and may convert correlated double sampling signals corresponding to the respective columns into digital signals by using a global code provided from the global counter.

The output buffer 150 may temporarily hold and output image data provided by the ADC 140 on a column basis. The output buffer 150 may temporarily store the image data provided by the ADC 140, in response to receiving a control signal of the timing controller 170. The output buffer 150 may operate as an interface device that compensates for a difference in the transmission rate (or processing speed) between the image sensing device 100 and another device coupled thereto.

The column driver 160 may select a column of the output buffer 150 on the basis of a control signal of the timing controller 170, and may sequentially transmit image data temporarily stored in the selected column of the output buffer 150. In an embodiment, the column driver 160 may select a column of the output buffer 150 by generating a column select signal on the basis of address signals received from the timing controller 170, and may transmit image data to the outside from the selected column of the output buffer 150.

The timing controller 170 may control at least one of the row driver 120, the correlated double sampler 130, the ADC 140, the out put buffer 150 and the column driver 160.

The timing controller 170 may provide a clock signal required for the operation of each component of the image sensing device 100, a control signal for timing control and address signals for selecting a row and a column, to at least one of the row driver 120, the correlated double sampler 130, the ADC 140, the output buffer 150 and the column driver 160. In an embodiment, the timing controller 170 may include a logic control circuit, a phase-locked loop (PLL) circuit, a timing control circuit and a communication interface circuit.

Figure 2:
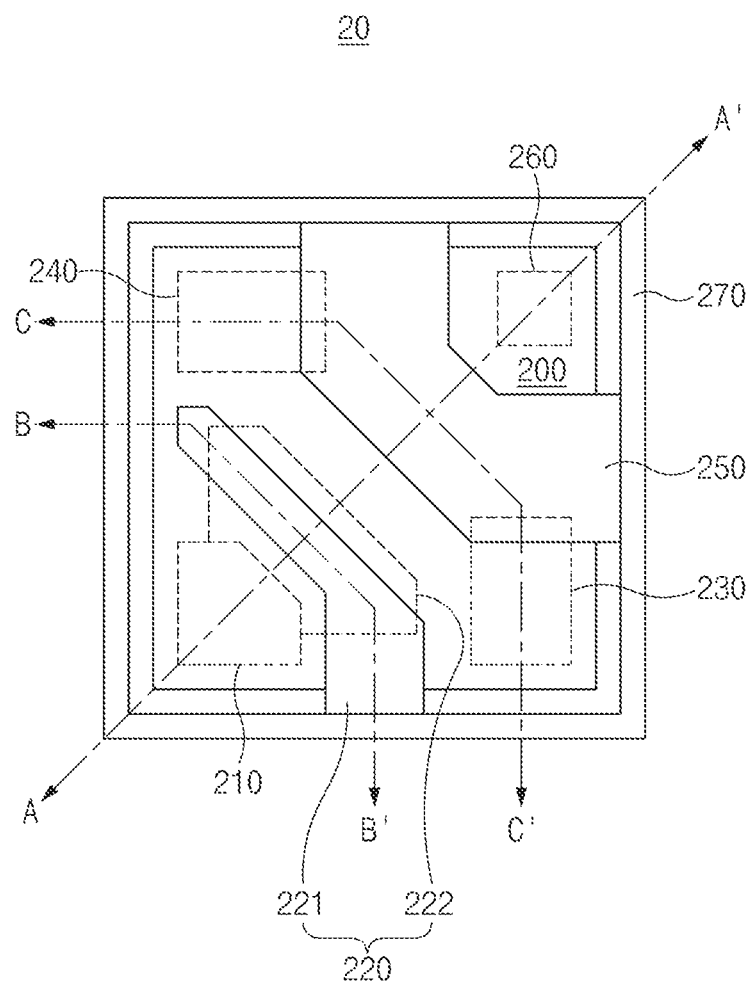
FIG. 2 illustrates an example layout of a unit pixel based on some embodiments of the disclosed technology.

FIG. 2 illustrates an example layout of a unit pixel 20 based on some embodiments of the disclosed technology.

In some implementations, unit pixels are repeatedly arranged on the pixel array 110 of FIG. 1, and the unit pixel 20 is the minimum unit of pixel.

The unit pixel 20 may include a plurality of material layers and structures formed in a substrate 200 or adjacent to one surface of the substrate 200. In some implementations, the substrate 200 may include a semiconductor material layer such as a silicon layer doped with an impurity or an epitaxial layer. In an example, the substrate 200 may be a silicon substrate doped with a P-type impurity.

In some implementations, the unit pixel 20 may include material layers and structures formed adjacent to the one surface of the substrate 200 as will be discussed below.

The unit pixel 20 may include a floating diffusion region 210, a transfer gate 220, a source region 230, a drain region 240, a pixel transistor gate 250, a contact region 260 and an isolation region 270.

The floating diffusion region 210 may accumulate photocharge generated at a photoelectric conversion region (not illustrated) responsive to light incident on the unit pixel 20, and a voltage corresponding to the accumulated photocharge may be transferred to electric circuits in the image sensing device through a pixel transistor.

The floating diffusion region 210 may have a polygonal shape, and the capacitance of the floating diffusion region 210 may vary depending on a depth of the floating diffusion region 210 formed in the substrate and a shape of the floating diffusion region 210.

In an implementation where the pixel PX has a plurality of si des and a plurality of angles, the floating diffusion region 210 may be disposed adjacent to a first vertex of the unit pixel 20. For example, in FIG. 2, the first vertex may indicate a left lower corner of the unit pixel 20.

In some implementations, the floating diffusion region 210 is closer to one of the vertices (e.g., the first vertex) than to any other vertex (e.g., a second vertex, a third vertex and a fourth vertex) of the unit pixel 20.

In some implementations, the floating diffusion region 210 may be closest to the first vertex any other elements included in the unit pixel 20.

The transfer gate 220 may be formed to abut on the floating diffusion region 210. The transfer gate 220 may include a coupling gate 221 and a recess gate 222. The recess gate 222 may be formed in the substrate 200, extending vertically from the one surface of the substrate 200 into the substrate 200.

The coupling gate 221 may be formed on the one surface of the substrate 200, and may be coupled to the recess gate 222 and signal lines or interconnects (not shown) formed in or on the substrate. The coupling gate 221 may be used to receive a transfer gate control signal through the signal lines or interconnects.

The transfer gate 220 may abut on the floating diffusion region 210 in a direction the line A-A' extends. The transfer gate 220 may have a shape extending along a surface in abutment with the floating diffusion region 210 (in a direction perpendicular to the line A-A').

The recess gate 222 may have a shape extending in a direction in which the floating diffusion region 210 and the transfer gate 220 abut on each other, and the coupling gate 221 may overlap at least partially the recess gate 222.

As the recess gate 222 and the coupling gate 221 extend in a diagonal direction of the unit pixel 20, an area for forming the transfer gate 220 may be secured, and it is possible to improve the photocharge transfer efficiency while reducing the area occupied by the transfer gate 220 in the unit pixel 20.

The transfer gate 220 may include a conductive material and a dielectric layer. The conductive material may include, for example, a metal or polysilicon. The transfer gate 220 may include the dielectric layer, which is used to isolate the floating diffusion region 210 and the photoelectric conversion region (not illustrated) from the conductive material included in the transfer gate 220.

The source region 230 may be formed in the substrate 200. The source region 230 may be doped with an impurity type different from that of the substrate 200. In an embodiment, when the substrate 200 is doped with a P-type impurity, the source region 230 may be doped with an N-type impurity.

The drain region 240 may be formed in the substrate 200, and may be doped with an impurity type different from that of the substrate 200. In an embodiment, when the substrate 200 is doped with a P-type impurity, the drain region 240 may be doped with an N-type impurity.

The source region 230 may be disposed adjacent to the second vertex of the unit pixel 20. In some implementations, the source region 230 is closest to one of the vertices (e.g., the second vertex)th an to any other vertex (e.g., the first vertex, the third vertex and the fourth vertex) of the unit pixel 20.

The drain region 240 may be disposed adjacent to the third vertex of the unit pixel 20. In some implementations, the drain region 240 is closest to one of the vertices (e.g., the third vertex) than to any other vertex (e.g., the first vertex, the second vertex, and the four th vertex) of the unit pixel 20.

The pixel transistor gate 250 may be positioned between the source region 230 and the drain region 240. The pixel transistor gate 250 may be formed to overlap at least portions of the source region 230 and the drain region 240.

The pixel transistor gate 250 may include a region that extends from the second vertex to the third vertex of the unit pixel 20. The pixel transistor gate 250, the source region 230 and the drain region 240 may be included in a pixel transistor. For example, the pixel transistor may be any one of a driving transistor, a reset transistor, a selection transistor and a double conversion gain transistor.

The pixel transistors are coupled to each other/to other circuits and the functions of the driving transistor, the reset transistor, the selection transistor and the double conversion gain transistor will be discussed l ater in this patent document with reference to FIG. 9.

When a signal having a voltage of an activation level is applied to the transfer gate 220, photocharges generated in the photoelectric conversion region (not illustrated) may be transferred to the floating diffusion region 210 and may be processed by the pixel transistors to be outputted as a pixel signal.

A control signal for the pixel transistor may be applied to each unit pixel 20 by a row driver (see 120 of FIG. 1), and a timing at which the control signal is applied may be controlled by the timing controller 170.

In an embodiment, one unit pixel 20 may include one pixel transistor. A decrease in the size of the unit pixel 20 can lead to a decrease in a region in which the pixel transistor is disposed in the unit pixel 20. When an area for forming the pixel transistor decreases, the distance between the source region 230 and the drain region 240 may decrease.

When the distance between the source region 230 and the drain region 240 decrease, a short channel effect may occur.

Due to the short channel effect, when the distance between the source region 230 and the drain region 240 of the pixel transistor is shortened, a breakdown voltage decreases and the leakage current between the source region 230 and the drain region 240 increases.

In other words, the decrease in the distance between the source region 230 and the drain region 240 can cause a current leakage between the source region 230 and the drain region 240 at a timing when a voltage signal applied to the pixel transistor gate 250 does not have an activation voltage level. When the short channel effect occurs, a distortion may occur in the pixel signal.

The short channel effect may be prevented when the source region 230 is sufficiently far from the drain region 240 which are formed in the unit pixel 20.

As the pixel transistor gate 250 is formed to extend from the second vertex to the third vertex of the unit pixel 20, the sufficient distance between the source region 230 and the drain region 240 included in the pixel transistor disposed in the unit pixel 20 may be secured.

The pixel transistor gate 250 may include a conductive material and a dielectric layer. The conductive material may include, for ex ample, a metal or polysilicon. The dielectric layer may isolate the pixel transistor gate 250 and the substrate 200. Also, the dielectric layer may isolate the conductive material, included in the pixel transistor gate 250, and the source region 230 and the drain region 240.

When a pixel transistor signal (e.g., a reset signal, a select signal or others) having an activation voltage level is applied to the pixel transistor gate 250, a channel region may be formed between the so urce region 230 and the drain region 240, and a current may flow thro ugh the channel region.

The contact region 260 may be positioned to be adjacent to the fourth vertex of the unit pixel 20. In some implementations, the contact region 260 is closest to one of the vertices (e.g., the fourth vertex) than to any other vertex (e.g., the first vertex, the second vertex, and the third vertex) of the unit pixel 20.

The contact region 260 may be doped with the same impurity as that of the substrate 200. For example, when the substrate 200 is doped with a P-type impurity, the contact region 260 may be doped with a P-type impurity.

The contact region 260 may have a higher doping concentration than the substrate 200. As the contact region 260 has a higher do ping concentration than the substrate 200, the resistance between a conductive line, coupled to the contact region 260, and the contact region 260 may be reduced.

A substrate voltage may be applied to the contact region 260 through the conductive line coupled to the contact region 260. The threshold voltage of the pixel transistor may be adjusted by the applied substrate voltage.

The isolation region 270 may be disposed along the edge of the unit pixel 20. By the isolation region 270, the photoelectric conversion region (not illustrated) included in the unit pixel 20 may be electrically and physically isolated.

In an embodiment, the isolation region 270 may be formed into a trench structure including a dielectric material. In another embodiment, the isolation region 270 may be formed by doping of an impurity. By the isolation region 270, the unit pixel 20 may be isolated from another adjacent unit pixel 20.

Figure 3:
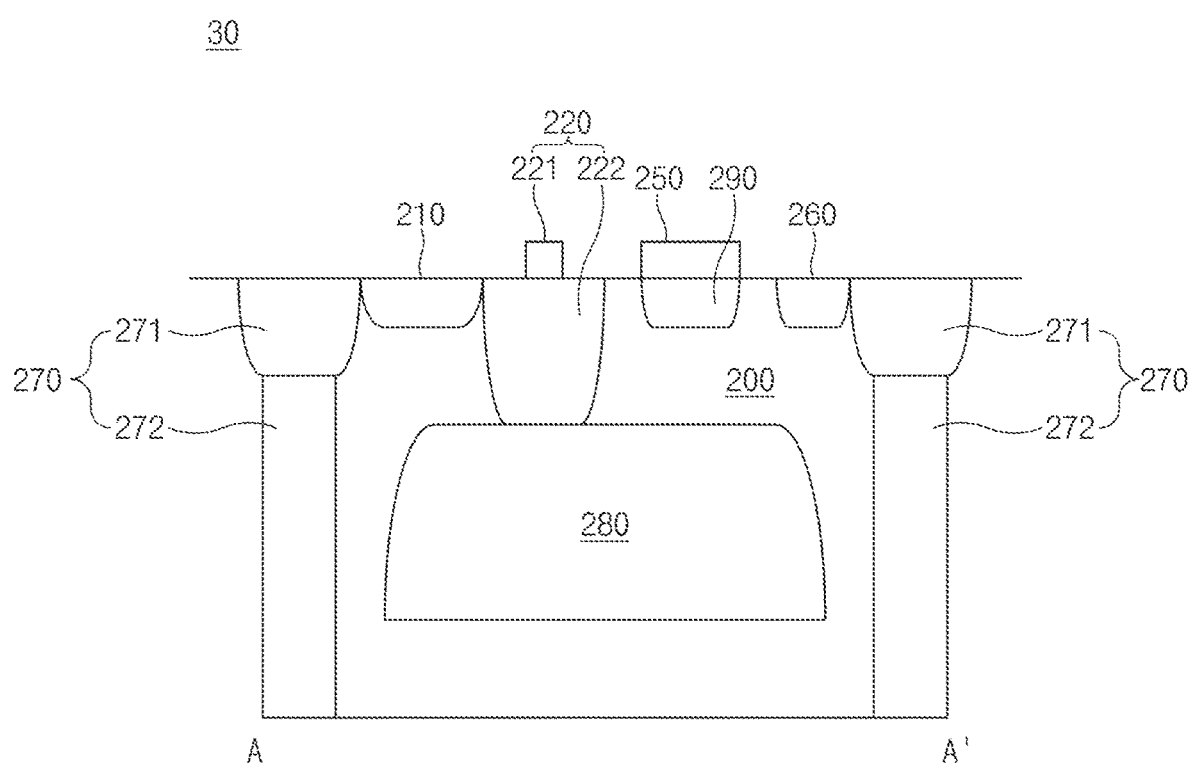
FIG. 3 illustrates an example cross-section of the unit pixel taken along A-A' based on some embodiments of the disclosed technology.

FIG. 3 illustrates an example cross-section 30 of the unit pixel taken along A-A' based on some embodiments of the disclosed technology.

FIG. 3 illustrates a vertical structure among the elements included in the unit pixel.

The unit pixel may include the substrate 200, and may include the floating diffusion region 210, the transfer gate 220, the pixel transistor gate 250, the contact region 260, the isolation region 270, a photoelectric conversion region 280 and a channel doping region 290.

The floating diffusion region 210 may be formed in a region which is adjacent to the first vertex of the unit pixel and is in contact with the one surface of the substrate 200.

The transfer gate 220 may be formed to abut on the floating diffusion region 210 and abut on the photoelectric conversion region 280. The transfer gate 220 may include the coupling gate 221 and the recess gate 222. The transfer gate 220 may be formed to overlap at least a portion of the photoelectric conversion region 280.

The coupling gate 221 and the recess gate 222 may include conductive materials which are coupled to each other. In an embodiment, the width of the coupling gate 221 may be narrower than the width of the recess gate 222. In another embodiment, the width of the coupling gate 221 may be wider than the width of the recess gate 222.

The recess gate 222 may extend from the one surface of the substrate 200 toward the photoelectric conversion region 280. The recess gate 222 may include a dielectric layer which is disposed along the side surface and the bottom of the recess gate 222. By the dielectric layer, a conductive material, included in the recess gate 222, and the floating diffusion region 210 may be isolated, and the conductive material, included in the recess gate 222, and the photoelectric conversion region 280 may be isolated.

When a voltage having an activation level is applied to the transfer gate 220, a channel region may be formed along the side surface of the transfer gate 220. The channel region may be formed between the photoelectric conversion region 280 and the floating diffusion region 210, and electrons may move from the photoelectric conversion region 280 to the floating diffusion region 210 through the channel region.

The pixel transistor gate 250 may be formed on the one surface of the substrate 200, and may be formed to overlap at least a portion of the photoelectric conversion region 280.

The contact region 260 may be adjacent to the fourth vertex of the unit pixel, and may be in contact with the one surface of the substrate 200.

The isolation region 270 may be formed into a structure which extends from the one surface of the substrate 200 to the other surface of the substrate 200.

The isolation region 270 may include a shallow trench 271 and a deep trench 272. In an embodiment, the shallow trench 271 and the deep trench 272 may be formed through an etching process and a deposition process for the substrate 200.

As the isolation region 270 is formed to extend from the one surface to the other surface of the substrate 200, it is possible to suppress the movement of photocharges between photoelectric conversion regions 280 included in adjacent unit pixels, respectively.

The photoelectric conversion region 280 may be positioned at a preset depth from the one surface of the substrate 200.

The photoelectric conversion region 280 may generate photo charges corresponding to received incident light. The photoelectric conversion region 280 may include an organic or inorganic photodiode. In some implementations, besides the photodiode, the photoelectric conversion region 280 may include a photosensitive element such as a photogate.

In an embodiment, the photoelectric conversion region 280 may be formed in a semiconductor substrate, and may be formed as impurity (P-type impurity and N-type impurity) regions having complementary conductivity types are vertically stacked.

The channel doping region 290 may be positioned under the pixel transistor gate 250 and may be in contact with the one surface of the substrate 200.

The channel doping region 290, as a region which is doped from the one surface of the substrate 200, may be doped with an impurity type opposite to that of the substrate 200. For example, when the substrate 200 is doped with a P-type impurity, the channel doping region 290 may be doped with an N-type impurity.

As the channel doping region 290 is formed, when a signal having an activation voltage level is applied to the pixel transistor gate 250, a channel region may be easily formed under the pixel transistor gate 250.

Figure 4:
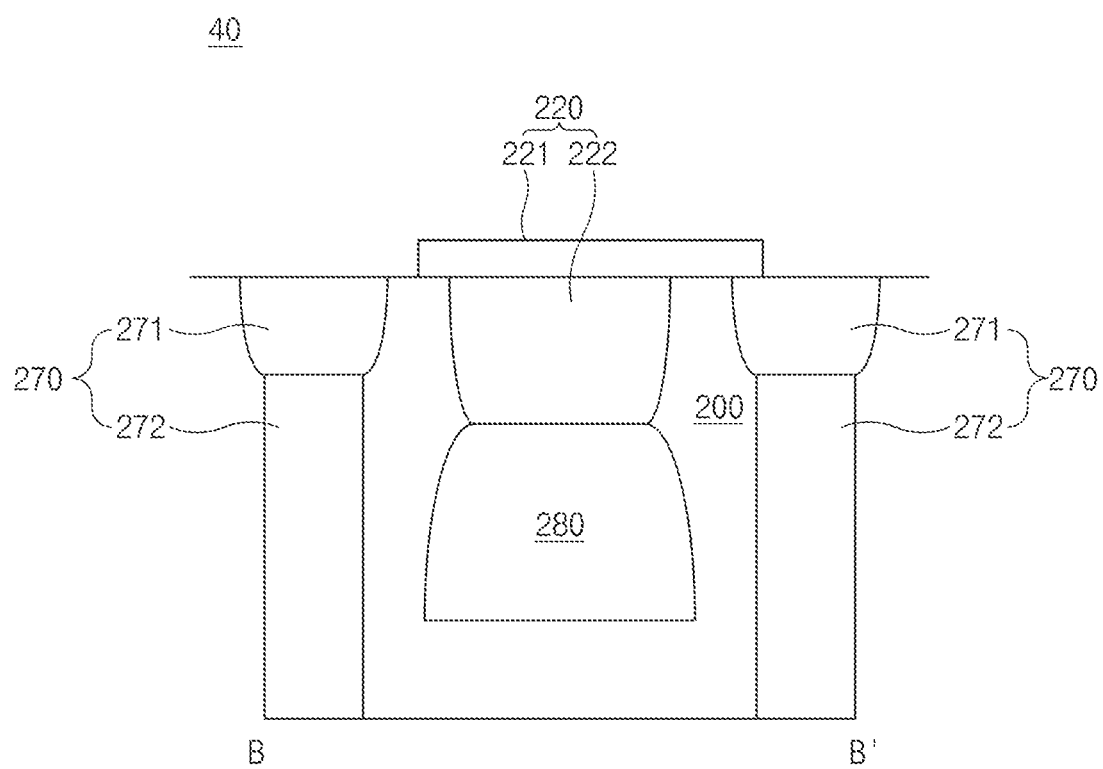
FIG. 4 illustrates an example cross-section of the unit pixel taken along B-B' based on some embodiments of the disclosed technology.

FIG. 4 illustrates an example cross-section 40 of the unit pixel taken along B-B' based on some embodiments of the disclosed technology.

FIG. 4 illustrates a cross-section taken by cutting the transfer gate 220 along the center portion thereof.

The photoelectric conversion region 280 may be isolated from photoelectric conversion regions, included in other adjacent unit pixels, by the isolation region 270. As shown in the cross-section diagram taken along the line B-B', the width of the coupling gate 221 may be wider than the width of the recess gate 222.

In an embodiment, the coupling gate 221 may overlap a port ion of the isolation region 270. In order to configure the layout of a signal line, the coupling gate 221 may extend to overlap a portion of the isolation region 270.

As the recess gate 222 is formed, the sufficient length of the channel region formed between the floating diffusion region and the photoelectric conversion region 280 may be secured. Since the recess gate 222 and the photoelectric conversion region 280 abut on each other, when a transfer signal having a voltage of an activation level is applied to the transfer gate 220, photocharges may easily move from the photoelectric conversion region 280 to the floating diffusion region.

Figure 5:
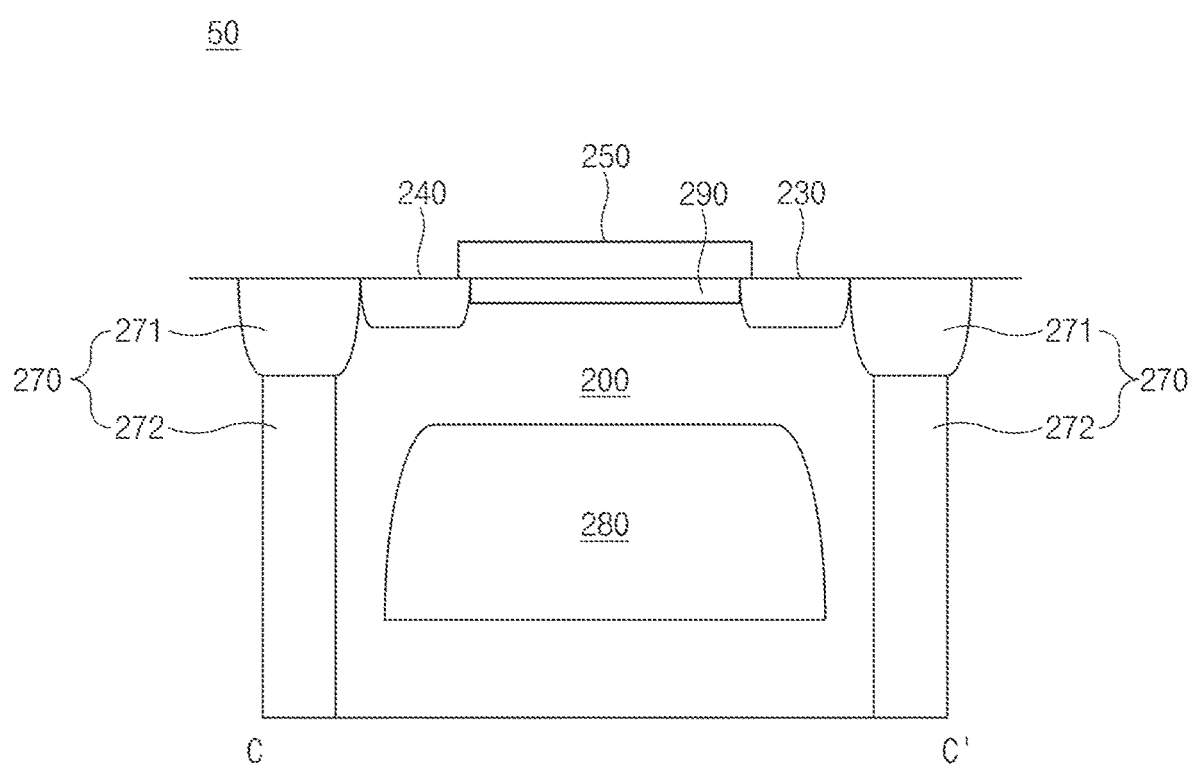
FIG. 5 illustrates an example cross-section of the unit pixel taken along C-C' based on some embodiments of the disclosed technology.

FIG. 5 illustrates an example cross-section 50 of the unit taken along C-C' based on some embodiments of the disclosed technology.

The pixel transistor gate 250 may be formed on the one surface of the substrate 200. The pixel transistor gate 250 may overlap the photoelectric conversion region 280.

The channel doping region 290 may be formed under the pixel transistor gate 250. The channel doping region 290 may be in contact with the one surface of the substrate 200, and may extend from the one surface of the substrate 200 toward the other surface of the substrate 200.

The source region 230 and the drain region 240 may be formed by doping an impurity into the one surface of the substrate 200. The pixel transistor gate 250 may be positioned between the source region 230 and the drain region 240. The source region 230 may be disposed adjacent to the second vertex of the unit pixel, and the drain region 240 may be disposed adjacent to the third vertex of the unit pixel.

In an embodiment, the channel doping region 290 may be doped from the one surface of the substrate 200 to a shallower depth than the source region 230 and the drain region 240. The channel doping region 290 may be doped with the same impurity type as that of the source region 230 and the drain region 240. The doping concentration of the channel doping region 290 may be lower than that of the source region 230 and the drain region 240.

The channel doping region 290 may be formed in a region narrower than the area of the pixel transistor gate 250.

Figure 6:
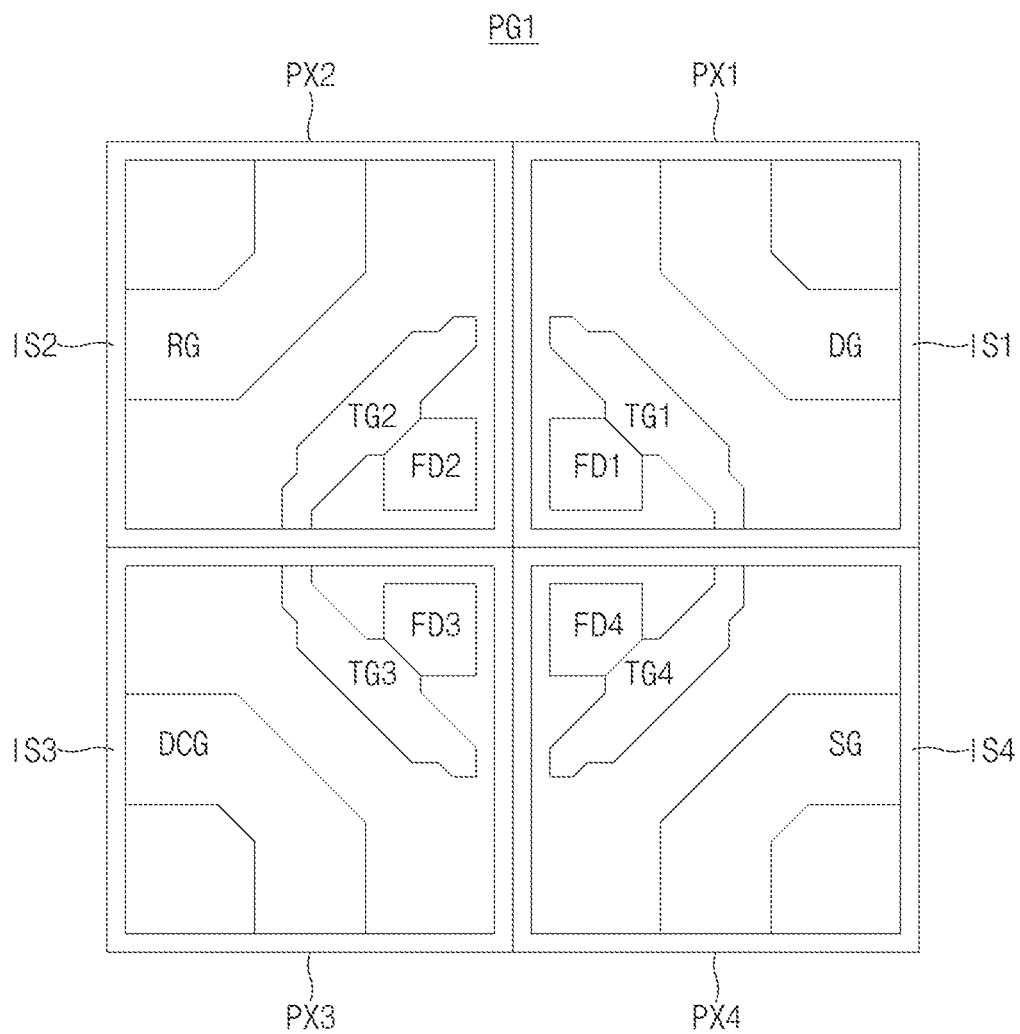
FIG. 6 illustrates an example layout of a first pixel group based on some embodiments of the disclosed technology.

FIG. 6 illustrates an example layout of a first pixel group based on some embodiments of the disclosed technology.

The first pixel group PG1 may include four unit pixels PX1, PX2, PX3 and PX4.

Although FIG. 6 illustrates only floating diffusion regions FD1, FD2, FD3 and FD4, transfer gates TG1, TG2, TG3 and TG4 and pixel transistor gates DG, RG, DCG and SG included in the respective unit pixels PX1, PX2, PX3 and PX4, the unit pixels PX1, PX2, PX3 and PX4 may further include other material layers/structures and/or electrical circuits.

The layout of a first unit pixel PX1 of FIG. 6 may correspond to the layout of the unit pixel 20 (see FIG. 2) described above with reference to FIG. 2.

The unit pixels PX1-PX4 may be symmetrical about the center of the first pixel group PG1.

The first unit pixel PX1 may include a first floating diffusion region FD1, a first transfer gate TG1, a driving transistor gate DG and a first isolation region IS1. The driving transistor gate DG may correspond to the pixel transistor gate 250 described above with reference to FIG. 2. The driving transistor gate DG may be included in a driving transistor, and the detailed function of the driving transistor will be described in detail with reference to FIG. 9.

The first floating diffusion region FD1 included in the first unit pixel PX1 may be disposed adjacent to a first vertex of the first unit pixel PX1.

The first transfer gate TG1 may abut on the first floating diffusion region FD1, and the driving transistor gate DG may be disposed in a shape that extends between a second vertex and a third vertex of the first unit pixel PX1.

The second unit pixel PX2 may include a second floating diffusion region FD2, a second transfer gate TG2, a reset transistor gate RG and a second isolation region IS2. The reset transistor gate RG may be included in a reset transistor, and the detailed function of the reset transistor will be described in detail with reference to FIG. 9.

The second floating diffusion region FD2 included in the second unit pixel PX2 may be disposed adjacent to a first vertex of the second unit pixel PX2.

The second transfer gate TG2 may abut on the second floating diffusion region FD2, and the reset transistor gate RG may be disposed in a shape that extends between a second vertex and a third vertex of the second unit pixel PX2.

The third unit pixel PX3 may include a third floating diffusion region FD3, a third transfer gate TG3, a double conversion gain transistor gate DCG and a third isolation region IS3. The double conversion gain transistor gate DCG may be included in a double conversion gain transistor, and the detailed function of the double conversion gain transistor will be described in detail with reference to FIG. 9.

The third floating diffusion region FD3 included in the third unit pixel PX3 may be disposed adjacent to a first vertex of the third unit pixel PX3.

The third transfer gate TG3 may abut on the third floating diffusion region FD3, and the double conversion gain transistor gate DCG may be disposed in a shape that extends between a second vertex and a third vertex of the third unit pixel PX3.

The fourth unit pixel PX4 may include a fourth floating diffusion region FD4, a fourth transfer gate TG4, a selection transistor gate SG and a fourth isolation region IS4. The selection transistor gate SG may be included in a selection transistor, and the detailed function of the selection transistor will be described in detail with reference to FIG. 9.

The fourth floating diffusion region FD4 included in the fourth unit pixel PX4 may be disposed adjacent to a first vertex of the fourth unit pixel PX4.

The fourth transfer gate TG4 may abut on the fourth floating diffusion region FD4, and the selection transistor gate SG may be disposed in a shape that extends between a second vertex and a third vertex of the fourth unit pixel PX4.

The first to fourth unit pixels PX1 to PX4 included in the first pixel group PG1 may be positioned such that the first vertices of the first to fourth unit pixels PX1 to PX4 are adjacent to the center of the first pixel group PG1. In other words, the first vertices of the first to fourth unit pixels PX1 to PX4 may abut on the center of the first pixel group PG1, and the floating diffusion regions FD1, FD2, FD3 and FD4 positioned adjacent to the first vertices may be adjacent to the center of the first pixel group PG1.

In another embodiment of the present disclosure, the isolation regions IS1 to IS4 positioned between the floating diffusion regions FD1, FD2, FD3 and FD4 may be omitted. When the isolation regions IS1 to IS4 are omitted, the floating diffusion regions FD1, FD2, FD3 and FD4 may be formed as one region.

The unit pixels PX1, PX2, PX3 and PX4 included in the first pixel group PG1 may share the pixel transistor gates DG, RG, DCG and SG.

For example, the floating diffusion regions FD1, FD2, FD3 and FD4 included in the first pixel group PG1 may be coupled to the driving transistor gate DG which is included in the first unit pixel PX1.

Also, the floating diffusion regions FD1, FD2, FD3 and FD4 may be coupled to the reset transistor including the reset transistor gate RG, and may be coupled to the double conversion gain transistor including the double conversion gain transistor gate DCG.

The driving transistor may be coupled to the selection transistor including the selection transistor gate SG, and the floating diffusion regions FD1, FD2, FD3 and FD4 and the pixel transistors may be coupled through metal wiring lines. The configuration and arrangement of the unit pixels PX1, PX2, PX3 and PX4 may vary depending on the configuration of the metal wiring lines or interconnects.

In an embodiment, the first to fourth unit pixels PX1 to PX4 are arranged such that the floating diffusion regions FD1, FD2, FD3 and FD4 are adjacent to one another, a region in which the metal wiring lines or interconnects for coupling the floating diffusion regions FD1, FD2, FD3 and FD4 are disposed may be minimized.

When a region in which the metal wiring lines are disposed is wide, parasitic capacitance generated in the unit pixels PX1 to PX4 may increase, resulting in an increase in the noise in pixel signals. Accordingly, the image sensing device implemented based on some embodiments of the disclosed technology can reduce the distortion of pixel signals.

In some embodiments of the disclosed technology, as the first pixel group PG1 includes the double conversion gain transistor, the conversion gain of a sensing node may be adjusted. The detailed function of the double conversion gain transistor will be described in detail with reference to FIG. 9.

Figure 7:
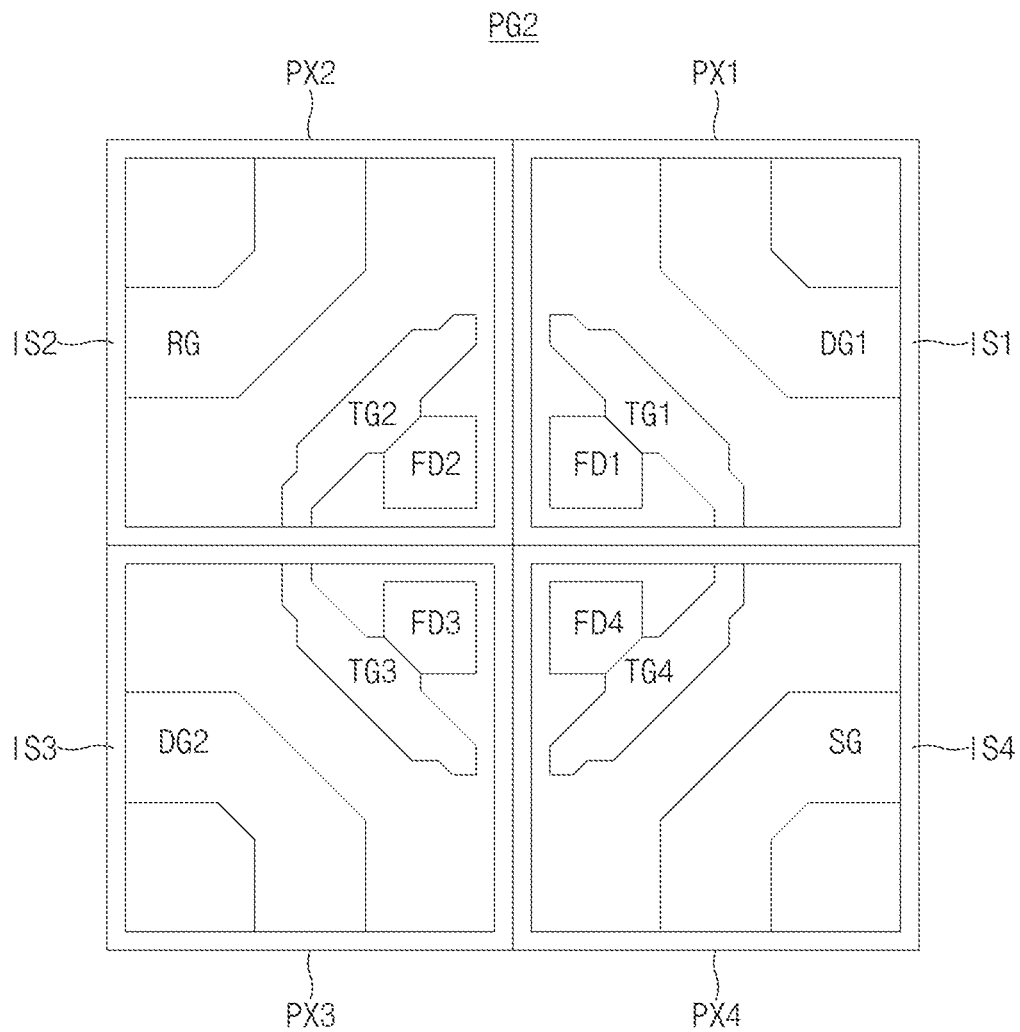
FIG. 7 illustrates an example layout of a second pixel group based on some embodiments of the disclosed technology.

FIG. 7 illustrates an example layout of a second pixel group based on some embodiments of the disclosed technology.

The second pixel group PG2 may include four unit pixels PX1, PX2, PX3 and PX4.

Although FIG. 7 illustrates only floating diffusion regions FD1, FD2, FD3 and FD4, transfer gates TG1, TG2, TG3 and TG4 and pixel transistor gates DG1, RG, DG2 and SG included in the respective unit pixels PX1, PX2, PX3 and PX4, the unit pixels PX1, PX2, PX3 and PX4 may further include other material layers/structures and/or electrical circuits.

Two pixel transistor gates among the pixel transistor gates D G1, RG, DG2 and SG included in the second pixel group PG2 may be driving transistor gates DG1 and DG2.

In some embodiments of the disclosed technology, a double conversion gain transistor gate included in a pixel group may be replaced with a driving transistor gate.

A first driving transistor gate DG1 and a second driving transistor gate DG2 included in the second pixel group PG2 may be included in a first unit pixel PX1 and a third unit pixel PX3, respectively.

A first driving transistor and a second driving transistor which include the first driving transistor gate DG1 and the second driving transistor gate DG2, respectively, may be coupled in parallel. For example, one end of the first driving transistor may be coupled to one end of a selection transistor, and one end of the second driving transistor may be coupled to the one end of the selection transistor.

By including the first driving transistor and the second driving transistor, the second pixel group PG2 based on some embodiments of the disclosed technology may increase the gate area of a driving transistor, reducing noise generated from the driving transistor.

Figure 8:
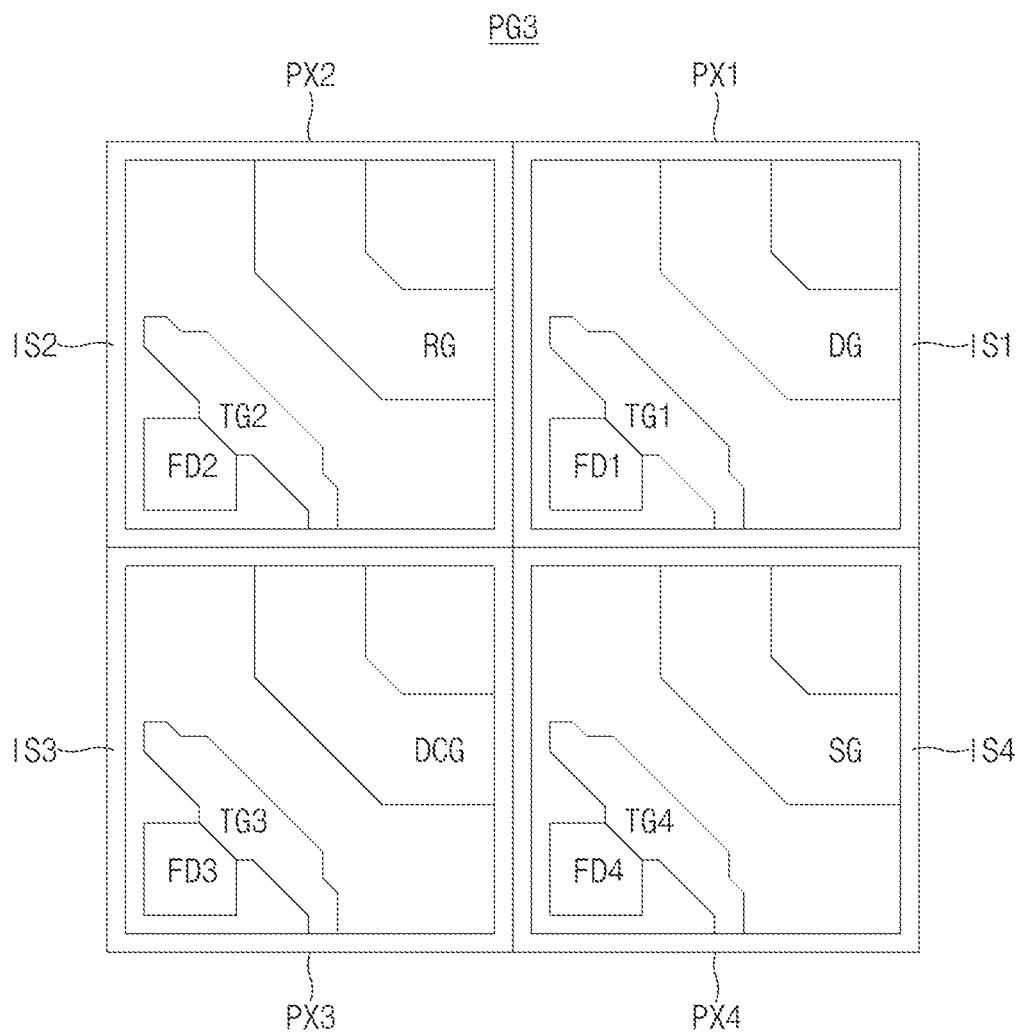
FIG. 8 illustrates an example layout of a third pixel group based on some embodiments of the disclosed technology.

FIG. 8 illustrates an example layout of a third pixel group based on some embodiments of the disclosed technology.

The third pixel group PG3 may include four unit pixels PX1, PX2, PX3 and PX4.

Although FIG. 8 illustrates only floating diffusion regions FD1, FD2, FD3 and FD4, transfer gates TG1, TG2, TG3 and TG4 and pixel transistor gates DG, RG, DCG and SG, the unit pixels PX1, PX2, PX3 and PX4 may further include other material layers/structures and/or electrical circuits.

First vertices of the respective unit pixels PX1, PX2, PX3 and PX4 included in the third pixel group PG3 may be positioned in the sa me direction from the centers of the respective unit pixels PX1, PX2, PX3 and PX4. The configuration and arrangement of unit pixels PX1, PX2, PX3 and PX4 included in a pixel group may vary depending on the configuration of metal wiring lines or interconnects.

Figure 9:
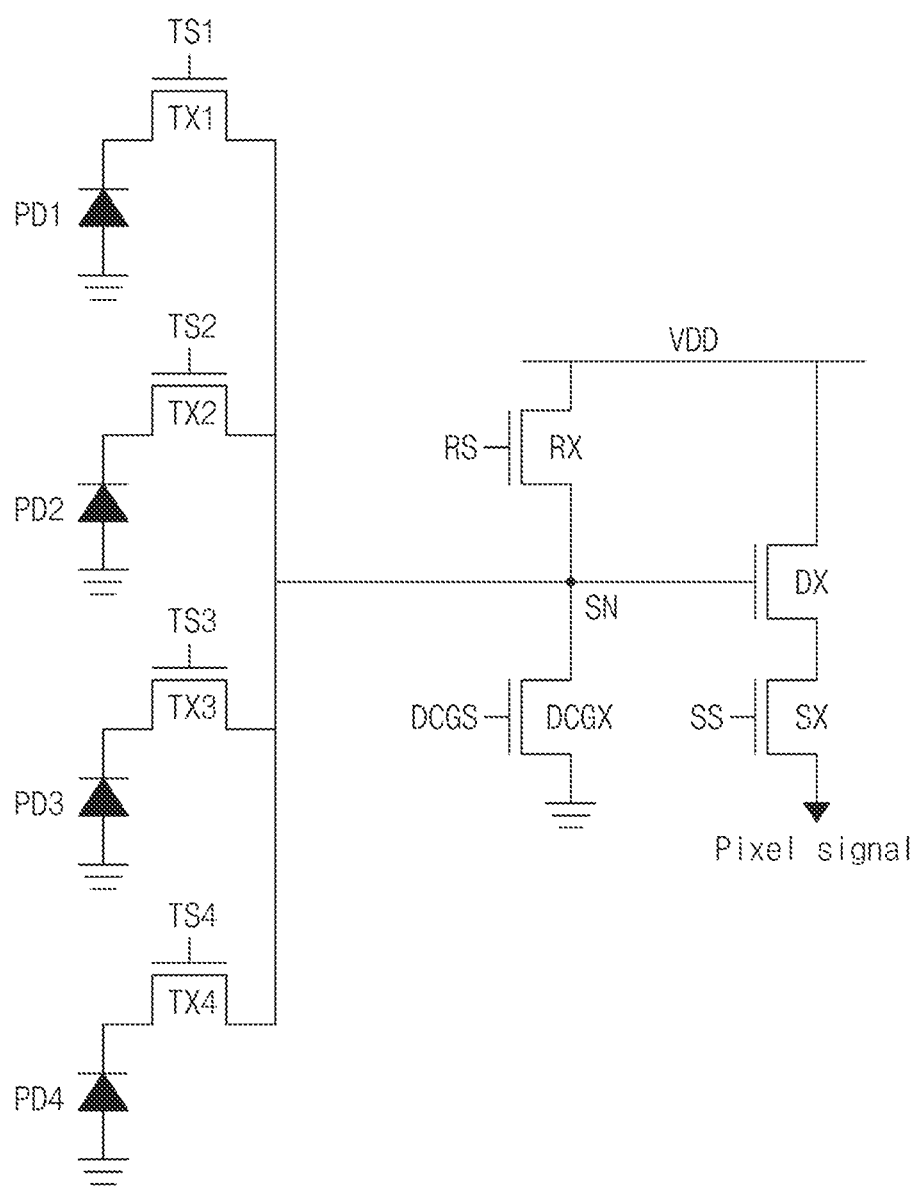
FIG. 9 illustrates example circuitry of a pixel group based on some embodiments of the disclosed technology.

FIG. 9 illustrates example circuitry of a pixel group based on some embodiments of the disclosed technology.

The circuit diagram of FIG. 9 may correspond to a pixel group that includes four unit pixels.

The pixel group with four unit pixels may include four unit pixels and photoelectric conversion regions PD1, PD2, PD3 and PD4 which are included in the unit pixels, respectively.

For example, a first photoelectric conversion region PD1 may be included in a first unit pixel, and the first photoelectric conversion region PD1 and a first transfer transistor TX1 may be coupled.

The first transfer transistor TX1 may receive a first transfer signal TS1 from the row driver 120 (see FIG. 1), and according to the voltage level of the received first transfer signal TS1, may transfer photocharges, generated in the first photoelectric conversion region PD1, to a sensing node SN.

Similarly, a second photoelectric conversion region PD2 may be coupled to the sensing node SN through a second transfer transistor TX2, a third photoelectric conversion region PD3 may be coupled to the sensing node SN through a third transfer transistor TX3, and a four th photoelectric conversion region PD4 may be coupled to the sensing node SN through a fourth transfer transistor TX4.

The sensing node SN may accumulate photocharges received from the photoelectric conversion regions PD1 to PD4, and may output a voltage signal corresponding to the accumulated photocharges.

For example, the sensing node SN may have a configuration to which four floating diffusion regions included in the unit pixels, respectively, are coupled, and the capacitance of the sensing node SN may be the sum of the capacitance of the four floating diffusion regions.

The sensing node SN may be coupled to one end of a double conversion gain transistor DCGX, and the other end of the double con version gain transistor DCGX may be grounded. The capacitance of the sensing node SN may be determined or adjusted based on the voltage level of a conversion gain signal DCGS which is applied to the double conversion gain transistor DCGX.

For example, when an image sensing device operates under a high-illuminance environment, photocharges of an amount exceeding the capacitance of the sensing node SN may be generated in the photoelectric conversion regions PD1 to PD4, and may be transferred to the sensing node SN.

In order to prevent the saturation phenomenon of the sensing node SN, the conversion gain signal DCGS having a voltage of an activation level may be applied under a high-illuminance photographing environment, and accordingly, the capacitance of the sensing node SN may be increased by the capacitance of the double conversion gain transistor DCGX.

As such, the image sensing device that includes the double conversion gain transistor DCGX can control the capacitance of the sensing node SN and secure a high dynamic range.

The sensing node SN may be coupled to a reset transistor RX. The other end of the reset transistor RX, which is not coupled to the sensing node SN may be coupled to a pixel voltage VDD. When a re set signal RS applied to the reset transistor RX has a voltage of an activation level, the voltages of elements coupled to the reset transistor RX may be reset to the level of the pixel voltage VDD.

As the reset transistor RX resets the elements, included in the pixel group, to the level of the pixel voltage VDD, an amount of photocharges collected in each of the photoelectric conversion regions PD1, PD2, PD3 and PD4 may be accurately detected.

The gate of a driving transistor DX may be coupled to the sensing node SN. The driving transistor DX may operate as a source follower transistor which amplifies the voltage of the sensing node SN.

One end of the driving transistor DX may be coupled to the pixel voltage VDD, and the other end of the driving transistor DX may be coupled to a selection transistor SX.

In an embodiment, the driving transistor DX may include a plurality of transistors.

For example, the driving transistor DX may include a transistor that includes the first driving transistor gate DG1 and a transistor that includes the second driving transistor gate DG2 illustrated in FIG. 7 that are coupled to each other.

The selection transistor SX may receive a select signal SS, and may output a voltage, amplified by the driving transistor DX, as a pixel signal according to the received select signal SS.

The pixel transistor described above may be any one of the driving transistor DX, the reset transistor RX, the selection transistor SX and the double conversion gain transistor DCGX. In an embodiment, each of unit pixels may include one pixel transistor.

In the case of the second pixel group PG2 described above with reference to FIG. 7, the driving transistor DX may be configured to include both a first driving transistor and a second driving transistor. Also, in the case of the second pixel group PG2, the double conversion gain transistor DCGX may be omitted, and one end of the sensing node SN may be grounded.

Figure 10:
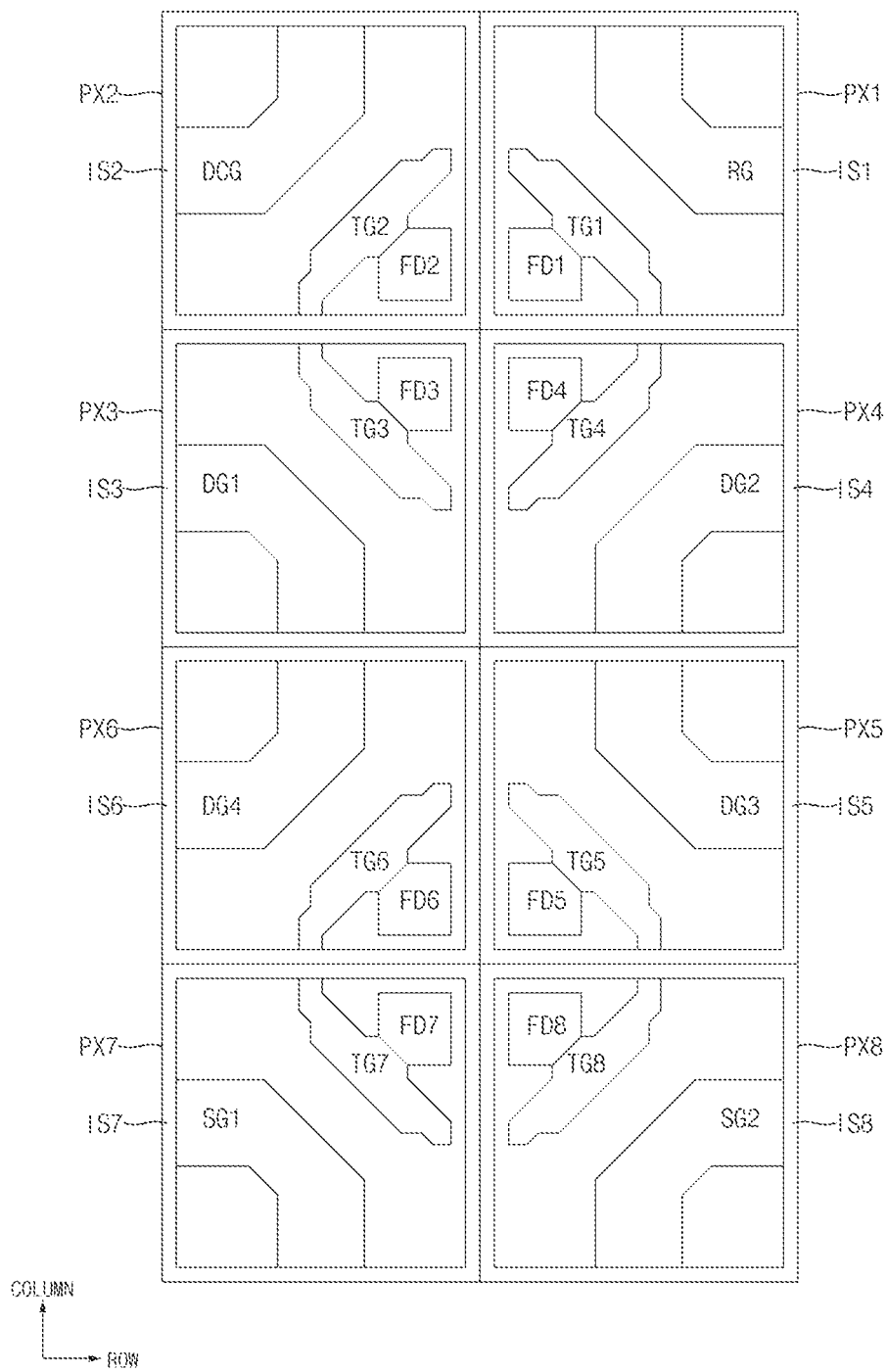
FIG. 10 illustrates an example layout of a fourth pixel group based on some embodiments of the disclosed technology.

FIG. 10 illustrates an example layout of a fourth pixel group based on some embodiments of the disclosed technology.

The fourth pixel group PG4 may include eight unit pixels PX1 to PX8, and FIG. 10 illustrates an exemplary layout in which the eight unit pixels PX1 to PX8 configure a shared pixel.

In an embodiment, the eight unit pixels PX1 to PX8 may configure a 2×4 array.

First vertices of first to fourth unit pixels PX1 to PX4 may be positioned adjacent to one another. As first to fourth floating diffusion regions FD1 to FD4 included in the first to fourth unit pixels PX1 to PX4, respectively, are positioned adjacent to the first vertices, the first to fourth floating diffusion regions FD1 to FD4 may be positioned adjacent to one another.

Similarly, fifth to eighth floating diffusion regions FD5 to FD8 included in fifth to eighth unit pixels PX5 to PX8, respectively, may be positioned adjacent to one another.

The fourth pixel group PG4 may include a reset transistor gate RG, a double conversion gain transistor gate DCG, four driving transistor gates DG1 to DG4 and two selection transistor gates SG1 and SG2.

The unit pixels PX3 to PX6 including the first driving transistor gate DG1 to the fourth driving transistor gate DG4, respectively, may be positioned to abut on one another, and first to fourth driving transistors including the first to fourth driving transistor gates DG1 to DG4, respectively, may be coupled to one another to operate as one driving transistor.

The unit pixels PX7 and PX8 including the first and second selection transistor gates SG1 and SG2, respectively, may be disposed adjacent to each other, and first and second selection transistors including the selection transistor gates SG1 and SG2, respectively, may be coupled to the driving transistors to adjust the output timing of a pixel signal.

Figure 11:
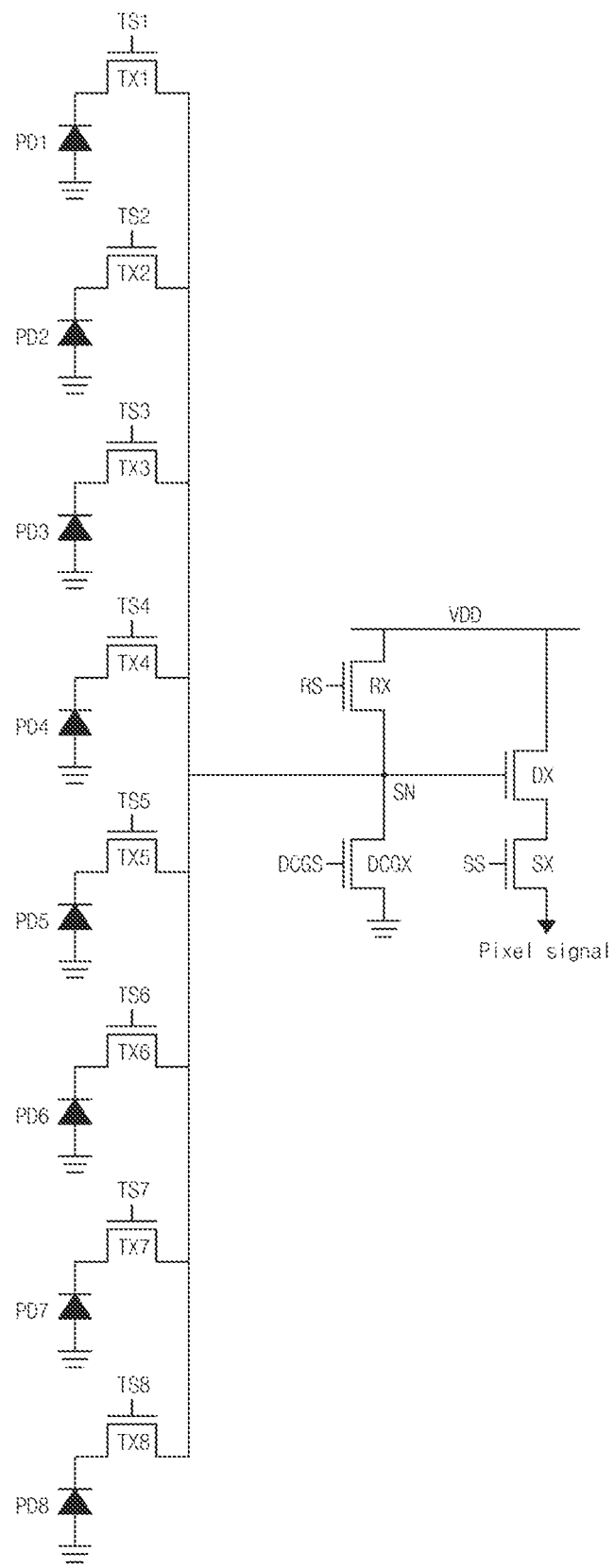
FIG. 11 illustrates example circuitry of a pixel group based on some embodiments of the disclosed technology.

FIG. 11 illustrates example circuitry of a pixel group based on some embodiments of the disclosed technology.

The circuit diagram of FIG. 11 may correspond to a pixel group that includes eight unit pixels.

The pixel group with eight unit pixels may include eight unit pixels and photoelectric conversion regions PD1 to PD8 which are included in the unit pixels, respectively.

For example, a first photoelectric conversion region PD1 may be included in a first unit pixel, and the first photoelectric conversion region PD1 and a first transfer transistor TX1 may be coupled.

The first transfer transistor TX1 may receive a first transfer signal TS1 from the row driver 120 (see FIG. 1), and according to the voltage level of the received first transfer signal TS1, may transfer photocharges, generated in the first photoelectric conversion region PD1, to a sensing node SN.

Similarly, second to eighth photoelectric conversion regions PD2 to PD8 may be coupled to the sensing node SN through second to eighth transfer transistors TX2 to TX8, respectively.

The sensing node SN may accumulate photocharges received from the photoelectric conversion regions PD1 to PD8, and may output a voltage signal corresponding to the accumulated photocharges.

For example, the sensing node SN may have a configuration to which eight floating diffusion regions included in the unit pixels, respectively, are coupled, and the capacitance of the sensing node SN may be the sum of the capacitance of the eight floating diffusion regions.

The sensing node SN may be coupled to one end of a double conversion gain transistor DCGX, and the other end of the double con version gain transistor DCGX may be grounded. The capacitance of the sensing node SN may be determined or adjusted based the voltage level of a conversion gain signal DCGS which is applied to the double conversion gain transistor DCGX.

For example, when an image sensing device operates under a high-illuminance environment, photocharges of an amount exceeding the capacitance of the sensing node SN may be generated in each of the photoelectric conversion regions PD1 to PD8, and may be transfer red to the sensing node SN.

In order to prevent the saturation phenomenon of the sensing node SN, the conversion gain signal DCGS having a voltage of an activation level may be applied under a high-illuminance photographing environment, and accordingly, the capacitance of the sensing node SN may be increased by the capacitance of the double conversion gain transistor DCGX.

As such, the image sensing device that includes the double conversion gain transistor DCGX can control the capacitance of the sensing node SN and secure a high dynamic range.

For example, a driving transistor DX may be an equivalent circuit of a circuit to which a plurality of transistors are coupled. For ex ample, the driving transistor DX may be an equivalent circuit of a circuit to which first to fourth driving transistors including the first to four th driving transistor gates DG1 to DG4, respectively, illustrated in FIG. 10 are coupled. As the first to fourth driving transistors are coupled to one another, it is possible to achieve an effect that the area of a driving transistor gate is increased.

The sensing node SN may be coupled to a reset transistor RX. The other end of the reset transistor RX which is not coupled to the sensing node SN may be coupled to a pixel voltage VDD. When a re set signal RS applied to the reset transistor RX has a voltage of an activation level, the voltages of elements coupled to the reset transistor RX may be reset to the level of the pixel voltage VDD.

As the reset transistor RX resets the elements, included in the pixel group, to the level of the pixel voltage VDD, an amount of photocharges collected in each of the photoelectric conversion regions PD1, PD2, PD3, PD4, PD5, PD6, PD7 and PD8 may be accurately detected.

The gate of the driving transistor DX may be coupled to the sensing node SN. The driving transistor DX may operate as a source follower transistor which amplifies the voltage of the sensing node SN.

One end of the driving transistor DX may be coupled to the pixel voltage VDD, and the other end of the driving transistor DX may be coupled to a selection transistor SX.

The selection transistor SX may receive a select signal SS, and may output a voltage, amplified by the driving transistor DX, as a pixel signal according to the received select signal SS.

For example, the selection transistor SX may be coupled to a plurality of transistors. For example, the selection transistor SX may be coupled to first to second selection transistors including the first and second selection transistor gates SG1 and SG2, respectively, illustrated in FIG. 10.

While various embodiments of the disclosed technology have been described above with reference to the accompanying drawings, the disclosed embodiments are merely examples of certain implementations. Accordingly, various modifications or enhancements to the disclosed embodiments and other embodiments can be made based on what is disclosed and/or illustrated in this patent document.

What is claimed is:

1. An image sensing device comprising:
a unit pixel configured to have a shape with first, second, third and fourth vertices where the second vertex and the third vertex are positioned in a diagonal direction of the unit pixel;
a floating diffusion region disposed adjacent to the first vertex of the unit pixel;
a transfer gate abutting on the floating diffusion region;
a source region disposed adjacent to the second vertex of the unit pixel;
a drain region disposed adjacent to the third vertex of the unit pixel; and
a pixel transistor gate positioned between the source region and the drain region,
wherein the unit pixel includes a contact region disposed adjacent to the fourth vertex of the unit pixel, and a substrate voltage is applied to the contact region.

2. The image sensing device according to claim 1, wherein the pixel transistor gate is any one of a driving transistor gate, a selection transistor gate and a reset transistor gate.

3. The image sensing device according to claim 1, wherein
the unit pixel includes a photoelectric conversion region formed in a substrate and generates photocharges corresponding to an incident light, and
the transfer gate includes a recess gate extending from one surface of the substrate toward the photoelectric conversion region.

4. The image sensing device according to claim 1, wherein the unit pixel comprises:
a photoelectric conversion region formed in a substrate and configured to generate photocharges corresponding to an incident light; and
an isolation region isolating the photoelectric conversion region from another adjacent unit pixel.

5. An image sensing device comprising:
a pixel group including four unit pixels adjacent to one another, each unit pixel configured to have a shape with first, second, third and fourth vertices and configured to detect incident light and generate photocharge corresponding to an intensity of the incident light,
each unit pixel comprising:
a floating diffusion region disposed adjacent to the first vertex of the unit pixel and configured to accumulate the photocharge generated by the unit pixel;
a transfer gate abutting on the floating diffusion region and configured to transfer the photocharge accumulated in the floating diffusion region;
a source region disposed adjacent to the second vertex of the unit pixel
a drain region disposed adjacent to the third vertex of the unit pixel; and
a pixel transistor gate positioned between the source region and the drain region,
wherein the second vertex and the third vertex are positioned in a diagonal direction of the unit pixel,
wherein the unit pixel includes a contact region disposed adjacent to the fourth vertex of the unit pixel, and a substrate voltage is applied to the contact region.

6. The image sensing device according to claim 5, wherein two of the pixel transistor gates included in the pixel group are driving transistor gates, and the driving transistor gates are coupled to each other.

7. The image sensing device according to claim 5, wherein at least one of the pixel transistor gates included in the pixel group is a double conversion gain transistor gate.

8. The image sensing device according to claim 5, wherein the first vertices of the unit pixels included in the pixel group are positioned adjacent to a center of the pixel group.

9. The image sensing device according to claim 8, wherein the floating diffusion regions included in the pixel group are positioned adjacent to the center of the pixel group.

10. The image sensing device according to claim 9, wherein the floating diffusion regions included in the pixel group are electrically coupled to one another.

11. The image sensing device according to claim 5, wherein the first vertices of the unit pixels included in the pixel group are positioned in the same direction from centers of the respective unit pixels.

12. An image sensing device comprising:
a pixel group including eight unit pixels adjacent to one another in a 2×4 matrix configuration, each unit pixel configured to have first, second, third and fourth vertices and configured to detect incident light and generate photocharge corresponding to an intensity of the incident light,
each unit pixel comprising:
a floating diffusion region disposed adjacent to the first vertex of the unit pixel and configured to accumulate the photocharges generated by the unit pixel;
a transfer gate abutting on the floating diffusion region and configured to transfer the photocharge accumulated in the floating diffusion region;
a source region disposed adjacent to the second vertex of the unit pixel;
a drain region disposed adjacent to the third vertex of the unit pixel;
a pixel transistor gate positioned between the source region and the drain region; and a contact region disposed adjacent to the fourth vertex of the unit pixel, wherein a substrate voltage is applied to the contact region, wherein the second vertex and the third vertex are positioned in a diagonal direction of the unit pixel.

13. The image sensing device according to claim 12, wherein four of the pixel transistor gates included in the pixel group are driving transistor gates, and the driving transistor gates are coupled to one another.

14. The image sensing device according to claim 12, wherein at least one of the pixel transistor gates included in the pixel group is a double conversion gain transistor gate.

15. The image sensing device according to claim 12, wherein the floating diffusion regions included in the pixel group are electrically coupled to one another.

* * * * *